United States Patent
Zelm (10) Patent No.: US 10,782,357 B1
(45) Date of Patent: Sep. 22, 2020

(54) AUTOMATIC INSULATION RESISTANCE TESTERS WITH HEATER

(71) Applicant: MEG-ALERT, INC., Minocqua, WI (US)

(72) Inventor: Richard J. Zelm, Lac Du Flambeau, WI (US)

(73) Assignee: MEG-ALERT, INC., Minocqua, WI (US)

( * ) Notice: Subject to any disclaimer, the term of this patent is extended or adjusted under 35 U.S.C. 154(b) by 49 days.

(21) Appl. No.: 15/983,925

(22) Filed: May 18, 2018

Related U.S. Application Data (63) Continuation of application No. 15/495,478, filed on Apr. 24, 2017, now Pat. No. 9,977,067, which is a continuation of application No. 14/211,419, filed on Mar. 14, 2014, now Pat. No. 9,664,716.

(60) Provisional application No. 61/798,613, filed on Mar. 15, 2013.

(51) Int. Cl.
  *G01R 31/50* (2020.01)
  *G01R 27/02* (2006.01)

(52) U.S. Cl.
  CPC .......... *G01R 31/50* (2020.01); *G01R 27/025* (2013.01)

(58) Field of Classification Search
  CPC .............................. G01R 31/50; G01R 27/025
  USPC ................................................. 324/510, 551
  See application file for complete search history.

(56) References Cited

U.S. PATENT DOCUMENTS

| | | | |
|---|---|---|---|
| 4,549,132 A | 10/1985 | Yamagiwa et al. | |
| 5,155,441 A | * 10/1992 | Zelm | G01R 31/025 324/551 |
| 5,172,289 A | 12/1992 | Zelm | |
| 5,514,967 A | 5/1996 | Zelm | |
| 5,524,448 A | 6/1996 | Schwanebeck et al. | |

(Continued)

FOREIGN PATENT DOCUMENTS

WO    2008003917    1/2008

OTHER PUBLICATIONS

Motor Insulation protection brochure, Eaton Corporation.
(Continued)

*Primary Examiner* — Farhana A Hoque
(74) *Attorney, Agent, or Firm* — Garvey, Smith & Nehrbass, Patent Attorneys, L.L.C.; Seth M. Nehrbass; Fabian M. Nehrbass (57) ABSTRACT

The present invention relates to improvements to automatic permanently installed insulation resistance test equipment. More particularly, the present invention relates to improvements to insulation test equipment for testing low voltage, medium voltage, and high voltage electrical equipment on the order of the rated voltage level while limiting the maximum output current to a safe level. The preferred test output voltage of the insulation test equipment would have a maximum test output of 5000 VDC, due to design considerations, but the AIRT test output could be made to be higher, up to a maximum of 15,000 VDC. After installation of the insulation test equipment in the control cabinet of the electrical equipment there will be no requirement to open the control cabinet to operate the insulation test equipment. The improvements will also allow personnel to perform an insulation test on electrical equipment without having to manually isolate the electrical equipment from the power source to perform the testing.

20 Claims, 10 Drawing Sheets

(56) References Cited

U.S. PATENT DOCUMENTS

| | | | |
|---|---|---|---|
| 5,612,624 | A | 3/1997 | Clinton |
| D390,200 | S | 2/1998 | Spano |
| 6,011,398 | A | 1/2000 | Bald et al. |
| 6,054,865 | A | 4/2000 | Bald et al. |
| 6,300,774 | B1 | 10/2001 | Lim |
| 6,538,420 | B2 | 3/2003 | Bald et al. |
| 7,020,571 | B2 | 3/2006 | Lee |
| 7,095,240 | B2 | 8/2006 | Wilson |
| 8,051,555 | B2 * | 11/2011 | Kim ................. H01L 24/81 228/180.5 |
| 8,487,637 | B2 | 7/2013 | Werle et al. |
| 9,664,716 | B1 | 5/2017 | Zelm |
| 9,977,067 | B1 | 5/2018 | Zelm |
| 2011/0031896 | A1 | 2/2011 | Vandevoorde et al. |
| 2012/0133389 | A1 | 5/2012 | Schroeder et al. |
| 2012/0212245 | A1 | 8/2012 | Pinto et al. |
| 2014/0253139 | A1 * | 9/2014 | Lindsey ............. G01R 31/50 324/510 |

OTHER PUBLICATIONS

Perfect Design for System Operation, Introducing Our Top of the Line Hipot/Insulation Resistance Testers—TOS9200 Series Brochure, Kikusui Electronics Corporation (kikusui tos920xds.pdf).

GenGuard Automatic Insulation Resistance Testers, Meg-Alert, Inc.—http://motorandgeneratorprotection.megalert.com/category/genguard-automatic-insulation-resistance-testers.

Safety Standards Measuring Instruments for Safety Testing—Hioki Products—www.hioki.com/product/safety.html.

* cited by examiner

REMOTE LED/CONTROL ASSEMBLY

BASIC MODEL 500 V AIRT

FIG. 10

AUTOMATIC INSULATION RESISTANCE TESTERS WITH HEATER

CROSS-REFERENCE TO RELATED APPLICATIONS

Priority of U.S. Provisional Patent Application Ser. No. 61/798,613, filed 15 Mar. 2013, which is incorporated herein by reference, is hereby claimed.

STATEMENT REGARDING FEDERALLY SPONSORED RESEARCH OR DEVELOPMENT

Not applicable

REFERENCE TO A "MICROFICHE APPENDIX"

Not applicable

BACKGROUND OF THE INVENTION

1. Field of the Invention

The present invention relates to improvements to automatic insulation test equipment. More particularly, the present invention relates to improvements to insulation test equipment for testing electrical equipment on the order of the rated voltage level while limiting the maximum output current to a safe level. Additionally, the invention relates to automatic insulation resistance testers with remote display and control panels that allow personnel to monitor the equipment without exposure to potential injury, such as an Arc Flash accident.

2. General Background of the Invention

To the best of inventor's knowledge, all the other insulation monitoring devices being made and sold in today's markets require personnel to open the control cabinet door in order to operate certain functions of the AIRT or to see the insulation readings on the device front plate display.

For more information regarding Arc Flash accidents and other potential dangers eliminated by the present invention, please see National Electric Safety Code (ANSI C2/NESC), 2012 Edition, as presented by Jim Tomaseski, IBEW Director of Safety and Health at the EEI Safety and Health Committee Conference, incorporated herein by reference.

The following U.S. Patents are incorporated herein by reference: my prior U.S. Pat. Nos. 5,155,441; 5,172,289; 5,514,967; and 5,524,448.

BRIEF SUMMARY OF THE INVENTION

The present invention includes various embodiments of automatic insulation resistance testers (AIRTs) that comprise an AIRT module that tests at rated voltage, installed, preferably permanently installed, in a device to be monitored, and a remote panel of indicators and controls that is located outside of the device's control panel. This allows for total remote operation of the AIRT to be operated without having to open the control panel, which eliminates potential for exposure of personnel to an Arc Flash accident. By designing an AIRT that tests at rated voltage and does not require any reason to open the control cabinet door, except for repair maintenance, we can eliminate the danger of an Arc Flash injury.

The various embodiments of the present invention can test both electrically ungrounded motors/generators and grounded motors/generators through use of a Ground Interrupter.

The present invention may include features from the inventions any of my prior U.S. Pat. Nos. 5,155,441; 5,172,289; 5,514,967; and 5,524,448.

BRIEF DESCRIPTION OF THE SEVERAL VIEWS OF THE DRAWINGS

For a further understanding of the nature, objects, and advantages of the present invention, reference should be had to the following detailed description, read in conjunction with the following drawings, wherein like reference numerals denote like elements and wherein.

DETAILED DESCRIPTION OF THE INVENTION

The present invention includes improvements to my previous inventions relating to Automatic Insulation resistance testers (Meg-alert Motorguard, Genguard) as shown in my prior U.S. Pat. Nos. 5,155,441; 5,172,289; and 5,514,967. These improved testers can be used with all low voltage (LV), medium voltage (MV), and high voltage (HV) equipment, grounded or ungrounded, and can provide for multiple testing of equipment. Please see also my products at www-.megalert.com A first embodiment of the apparatus of the present invention includes an arc-safe automatic insulation resistance tester (AIRT) for low voltage (LV) equipment 100 (see FIG. 1).

Figure 1:
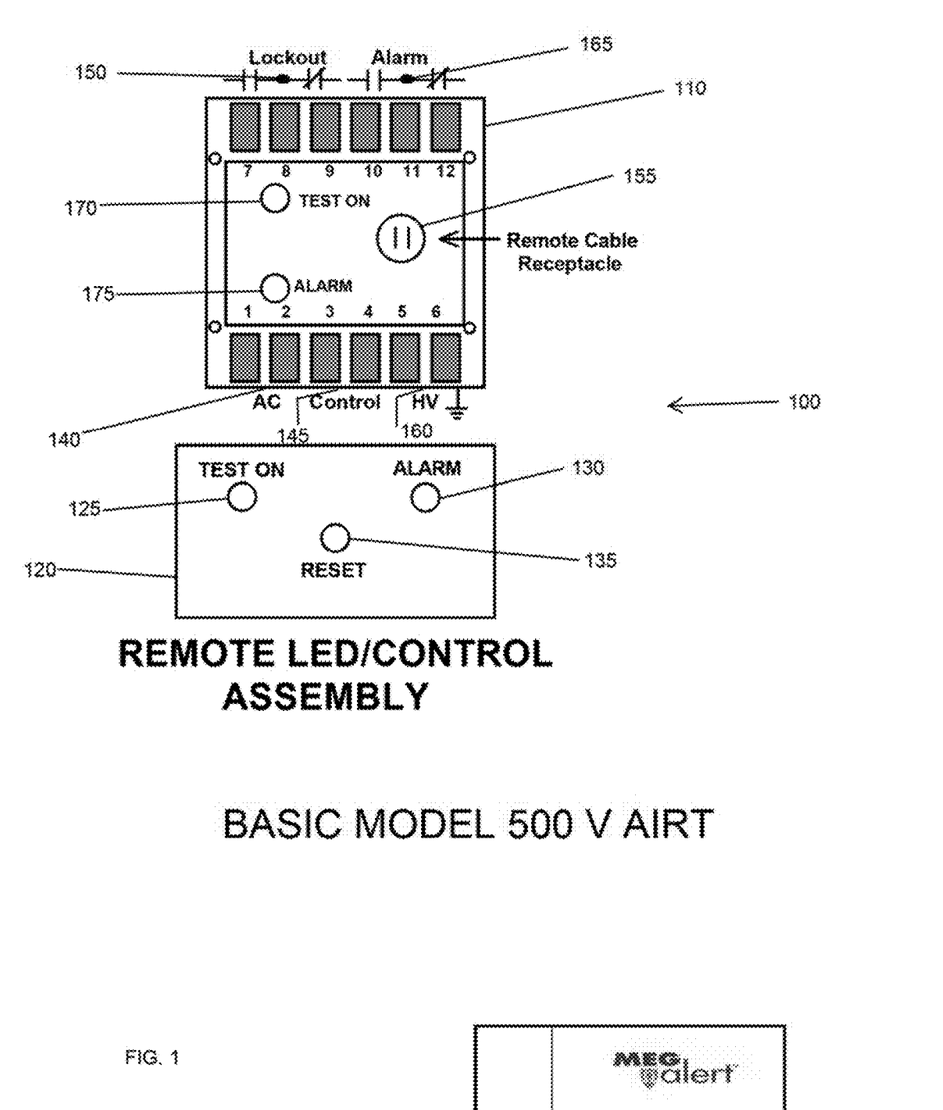
FIG. 1 shows a Basic Model 500-Volt AIRT with remote LED/Control.

The apparatus 100 includes a permanently installed AIRT 110 similar to the AIRT described in U.S. Pat. Nos. 5,155,441 and 5,172,289, having a test output of at least 500 VDC (volts direct current), that is mounted inside the equipment control panel and has all the control devices needed to operate the AIRT and indicators brought out to a remote panel 120 located on the outside of the control panel door. This allows the AIRT 110 to be operated without having to open the door and exposing personnel to an Arc Flash accident. Other currently available insulation monitoring devices being made and sold in today's markets require personnel to open the control cabinet door in order to operate certain functions of the AIRT or to see the insulation readings on the device front plate display. By designing an AIRT that does not require any reason to open the control cabinet door, except for repair maintenance, the present invention can eliminate the danger of an Arc Flash injury.

The AIRT 100 preferably consists of two parts, the AIRT module 110 and the remote control/display assembly 120. The remote control/display assembly 120 may have all or some of the following control functions on it: Power On LED, Test On LED 125, Pre-Alarm LED, Alarm LED 130, On/Off switch, Test/Calibrate Button, Calibration Potentiometer, and Reset button 135. Previous models do not include all these functions on the remote assembly. The preferred embodiment also has terminals on the module 110 for AC input 140, Control signal 145, Test output and Ground 160, Lockout contacts 150, and a receptacle 155 on the front panel for connecting the module 110 to the remote control assembly 120. Inside the preferred AIRT module 110 consists of a low voltage power supply, a high voltage power supply, a comparator circuit, an alarm relay circuit, and an isolation relay circuit similar to the Meg-alert GP500 AIRT testers. The preferred embodiment also includes on the AIRT module 110, alarm contacts 165, a test on LED 170, and an alarm LED 175.

The AIRT 100 is preferably more compact and easier to install in modern control cabinets where space is a problem. The new model AIRT preferably also has an optional auto reset feature where the alarm 165 and lockout circuit 150 will reset itself automatically when the insulation levels go back above the set point. This would eliminate a person from having to reset the unit manually after an alarm condition at remote locations where normal maintenance personnel are not onsite. The new model AIRT units 100 are preferably capable of being calibrated without having to access the module like on the old style AIRT units.

Figure 2:
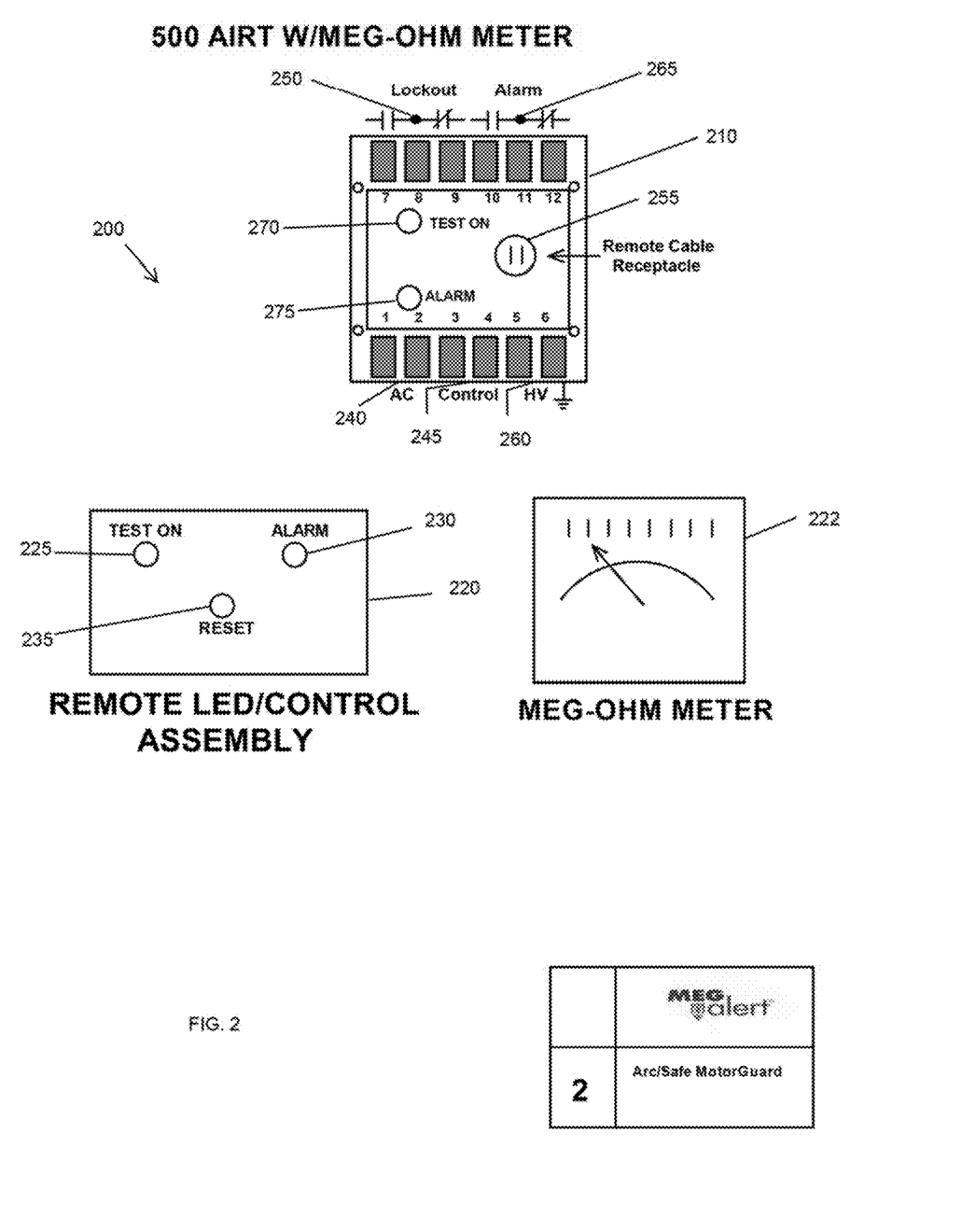
FIG. 2 shows a 500 AIRT with remote LED/Control and Megohm Meter.

A second embodiment of the apparatus of the present invention includes an arc-safe automatic insulation resistance tester (AIRT) for low voltage (LV) equipment with a megohm meter 200 (see FIG. 2).

The apparatus 200 includes a permanently installed AIRT 210 similar to the AIRT described in the first embodiment above and having a test output of at least 500 VDC. The AIRT 210 is preferably mounted inside the equipment control panel and has all the control devices needed to operate the AIRT and indicators brought out to a remote panel 220 located outside of the control panel. This allows the AIRT 210 to be operated without having to open the door and exposing personnel to an Arc Flash accident.

The AIRT system 200 consists of three parts, the AIRT module 210, the remote control/display assembly 220, and a megohm meter 222. The remote control/display assembly 220 preferably has the following control functions on it: Test On LED 225, Alarm LED 230, and Reset button 235. A preferred embodiment also includes a data port (not shown in FIG. 2) for tracking the megohm readings via a SCADA (supervisory control and data acquisition) or PLC (programmable logic controllers) based industrial control system. The preferred embodiment also has terminals on the module 210 for AC input 240, Control signal 245, Test output and, Ground 260, Lockout contacts 250, and a receptacle 255 on the front panel for connecting the module 210 to the remote control assembly 220. Inside the preferred AIRT module 210 consists of a low voltage power supply, a high voltage power supply, a comparator circuit, an alarm relay circuit, and an isolation relay circuit similar to the Meg-alert GP500 AIRT testers. The preferred embodiment also includes on the AIRT module 210, alarm contacts 265, a test on LED 270, and an alarm LED 275.

The AIRT 200 is preferably more compact and easier to install in modern control cabinets where space is a problem. The new model AIRT preferably also has an optional auto reset feature where the alarm 265 and lockout circuit 250 will reset itself automatically when the insulation levels go back above the set point. This would eliminate a person from having to reset the unit manually after an alarm condition at remote locations where normal maintenance personnel are not onsite.

Figure 3:
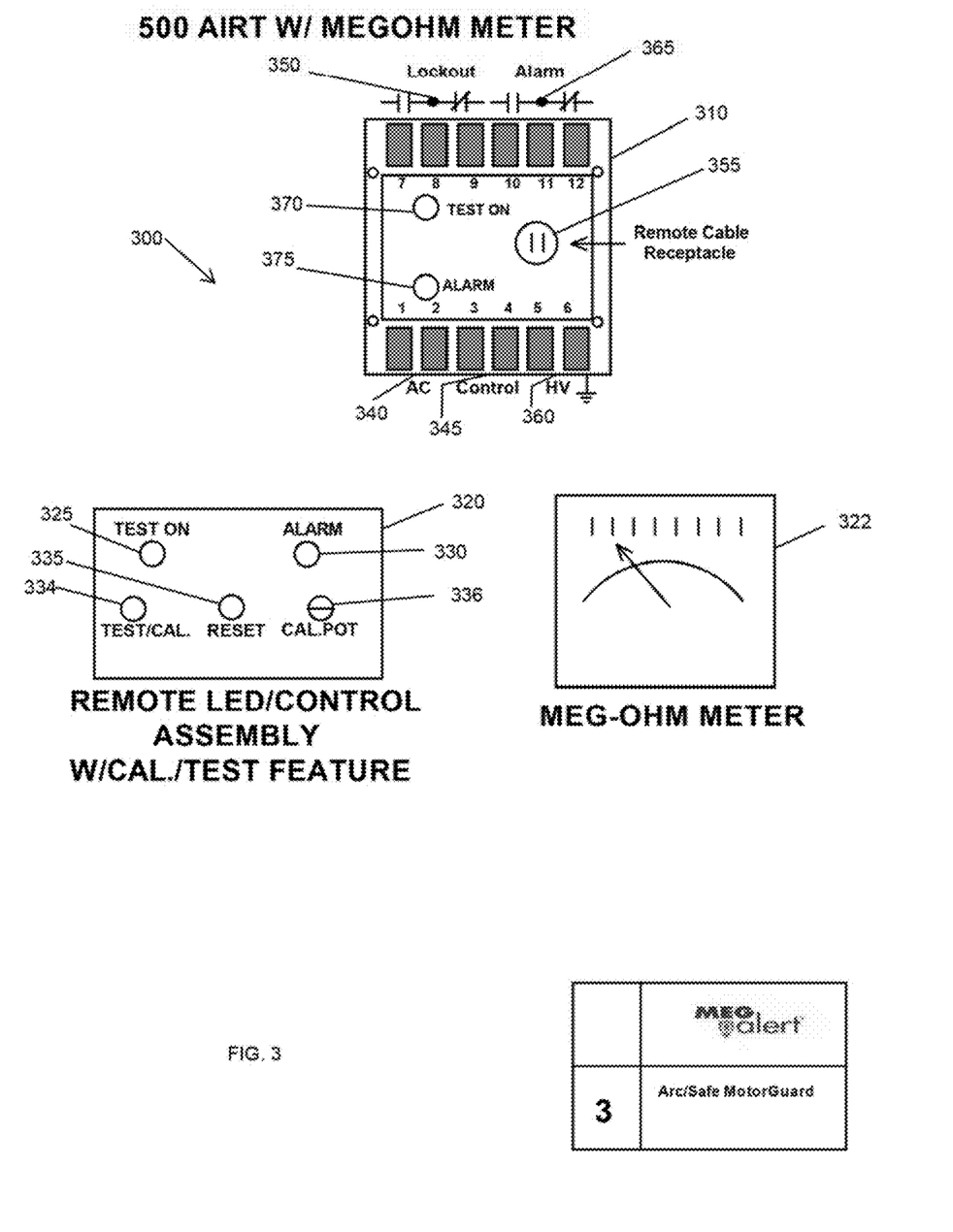
FIG. 3 shows a 500 AIRT with remote LED/Control including calibration and test functions and Megohm Meter.

A third embodiment of the apparatus of the present invention includes an arc-safe automatic insulation resistance tester (AIRT) for low voltage (LV) equipment with megohm meter and remote calibration/test features 300 (see FIG. 3).

The apparatus 300 includes a permanently installed AIRT 310 similar to the AIRT described in the second embodiment above, that is mounted inside the equipment control panel and has all the control devices needed to operate the AIRT and indicators brought out to a remote panel 320 located on the outside of the control panel door, allowing the AIRT 310 to be operated without having to open the door and exposing personnel to an Arc Flash accident.

The AIRT 300 consists of three parts, the AIRT module 310, the remote control/display assembly with calibration test feature 320, and the megohm meter 322. The remote control/display assembly 320 has all or some of the following control functions on it: Power On LED (not shown in FIG. 3), Test On LED 325, Pre-Alarm LED (not shown in FIG. 3), Alarm LED 330, On/Off switch (not shown in FIG. 3), Test/Calibrate Button 334, Calibrate Potentiometer 336, and Reset button 335. Previous models do not include all these functions on the remote assembly. A preferred embodiment also includes a visual display 322 of the megohm readings out on the door panel along with the remote control panel 320 and a data port (not shown in FIG. 3) for tracking the megohm readings via a SCADA (supervisory control and data acquisition) or PLC (programmable logic controllers) based industrial control system. The preferred embodiment also has terminals on the module 310 for AC input 340, Control signal 345, Test output and Ground 360, Lockout contacts 350, and a receptacle 355 on the front panel for connecting the module 310 to the remote control assembly 320. Inside the preferred AIRT module 310 consists of a low voltage power supply, a high voltage power supply, a comparator circuit, an alarm relay circuit, and an isolation relay circuit similar to the Meg-alert GP500 AIRT testers. The preferred embodiment also includes on the AIRT module 310, alarm contacts 365, a test on LED 370, and an alarm LED 375.

The AIRT 300 is preferably more compact and easier to install in modern control cabinets where space is a problem. The new model AIRT preferably also has an optional auto reset feature where the alarm 365 and lockout circuit 350 will reset itself automatically when the insulation levels go back above the set point. This would eliminate a person from having to reset the unit manually after an alarm condition at remote locations where normal maintenance personnel are not onsite. The new model AIRT units 300 are preferably capable of being calibrated without having to access the module like on the old style AIRT units. A remote Calibrate Potentiometer 336 and Test/Cal. Button 334 located on the remote control/display assembly 320 would allow maintenance personnel to calibrate and test the functions of the AIRT 300 without having to access the AIRT module 310 inside the control panel.

Figure 4:
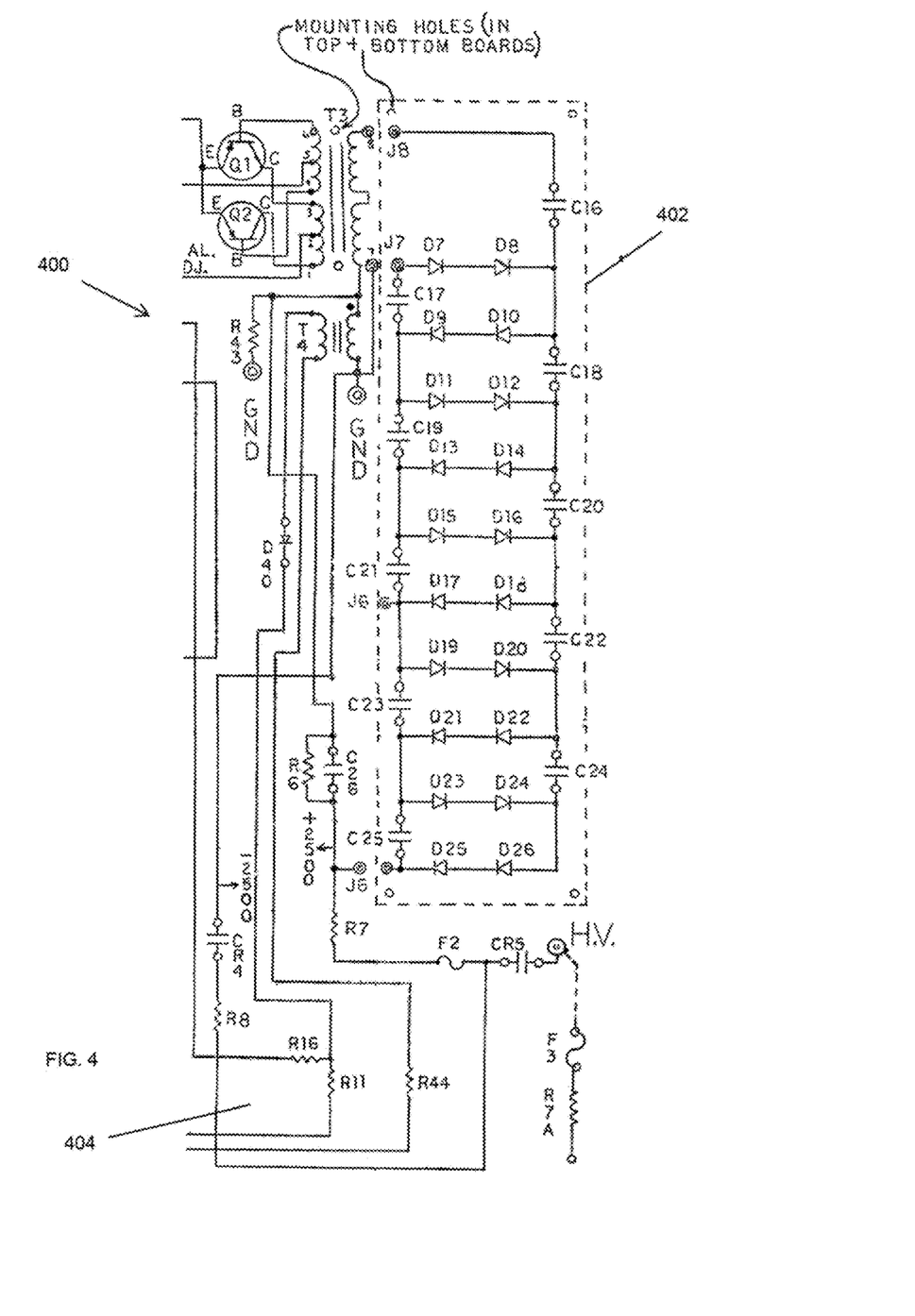
FIG. 4 shows an Iso-Sense Circuit.

FIG. 4 is a circuit diagram for the new "ISO-SENSE" circuit 400 used in the improved AIRTs. This new design "ISO-SENSE" circuit 400 uses a special HV transformer T4 with its primary winding added into series with the output secondary of the HV transformer T3 that powers an HV voltage multiplier circuit 402. The HV multiplier circuit 402 includes diodes D7-D26 and capacitors C16-C26. The secondary of the transformer T4 is designed to amplify the small voltage being generated in the primary to a slightly greater value dependant on the voltage load of the HV multiplier circuit 402. This secondary voltage is then fed into the resistor bridge 404 created by R11, R16, and R44 that controls the megohm current meter circuit. A blocking diode D40 is used to prevent the current from reversing through the meter circuit and driving the meter backwards. This new circuit design allows for complete isolation of the HV circuitry from the LV circuitry while causing the meter to reflect the changes in the load to the HV multiplier circuit, indicating the insulation value of the equipment being tested. This is done without the solid state photo transistor and instead relies on the use of a transformer, diode, and resistor circuitry that has no change in accuracy over time and is made of much more reliable components than the circuitry currently available.

As shown in FIG. 4, transformer T4 is a sensing transformer which senses the voltage on transformer T3 and sends that signal to the diode D40 resistor and bridge 404 to drive the metering display circuit using the wires coming out of R11 and R44.

Figure 5:
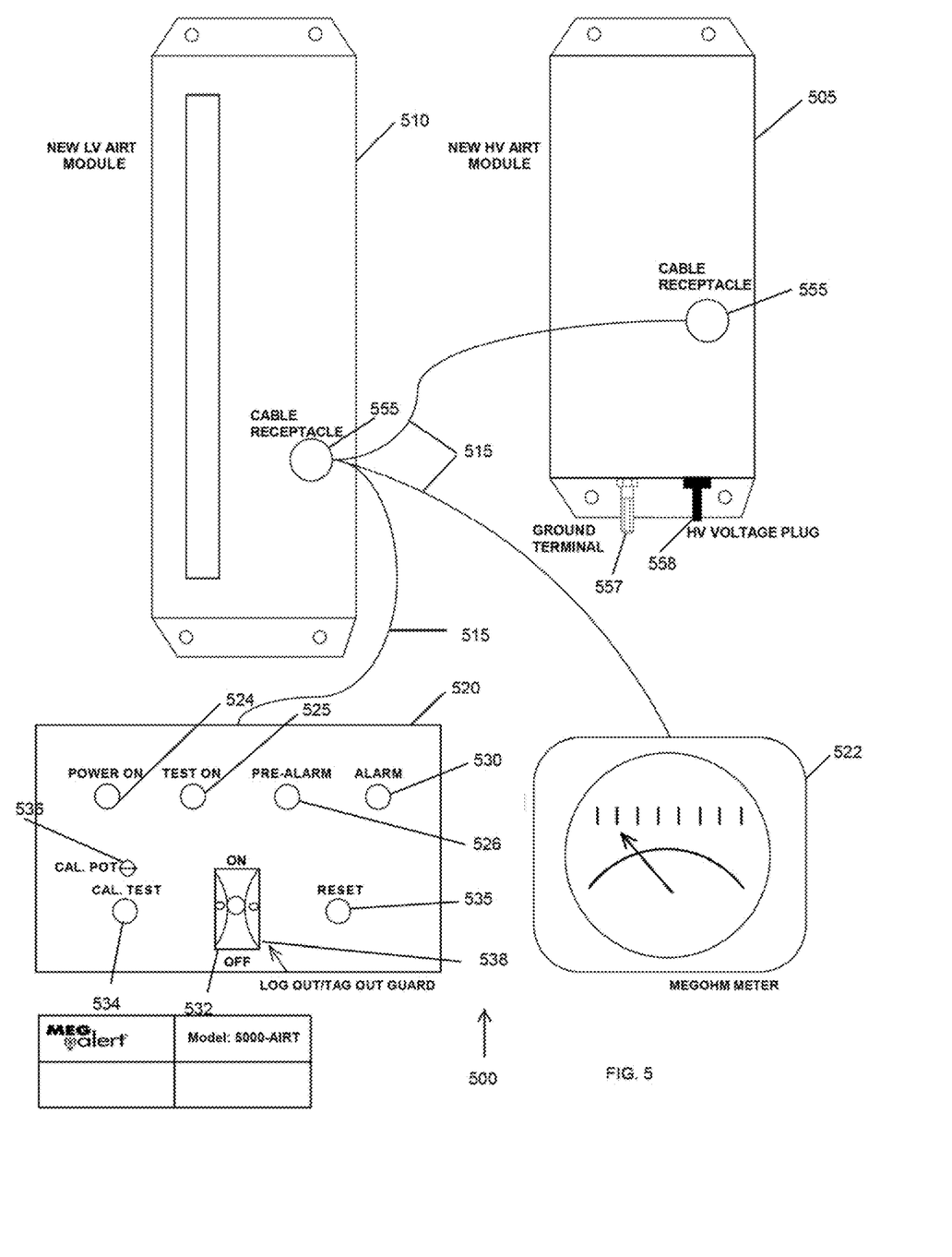
FIG. 5 shows an arc-safe AIRT for MV (600-7,200V) and HV (+7,200V) equipment.

A fourth embodiment of the apparatus of the present invention includes an arc-safe AIRT for medium voltage (MV) and high voltage (HV) equipment (see FIG. 5).

A permanently installed automatic insulation resistance tester 500, having a test output of 2500 or 5000 or up to a maximum of 15,000 VDC for testing and monitoring the insulation resistance of medium and high voltage equipment. The AIRT 500 preferably consists of two modules, a compact HV module 505 to be mounted inside the HV compartment of the control cabinet and a LV control module 510 to be mounted inside the LV compartment of the control panel. The new industry standard is to build smaller compact control panels and it is not always possible to mount a standard size AIRT inside the HV compartment. The new model AIRT 500 preferably has a small compact HV test and isolation module 505 that will easily fit inside the HV compartment and a LV control module 510 that would mount in the LV compartment. The HV module 505 preferably also has a ground terminal 557 and an HV voltage test output plug 558. An interconnecting cable 515 is preferably installed between the two modules via cable receptacles 555 on the two modules, and the LV control module 510 is preferably operated by a remote LED/display assembly 520 located outside the cabinet on the LV door. There is also a visual megohm meter display 522 mounted outside the LV door to show personnel the insulation resistance readings. The new AIRT 500 does not require any access to the inside of the LV or the HV compartments in order to operate the system, which eliminates the possibility of exposing personnel to Arc Flash accidents.

The old style AIRT tester, for example the AIRT described in U.S. Pat. No. 5,514,967, used an old technology Opto transistor as an HV isolator device for the low voltage comparator circuit and it was very unstable component. This new AIRT uses a new design "Iso-sense" circuit (see FIG. 4) to isolate the HV test output from the LV control circuits. The "ISO-SENSE" circuit consists of a HV transformer, diode, and resistor circuit that takes the place of the old style Opto transistor. This new circuit will increase the reliability and accuracy of the new AIRT tremendously.

The remote LED/control assembly 520 may provide some or all of the following functions, including Power On 524, Test On 525, Pre-alarm 526, Alarm 530, Locking on/off switch 532, test/cal. Switch 534, reset switch 535, and a calibration Potentiometer 536. The AIRT 500 may also have a remote visual display megohm meter 522 to indicate the insulation readings out on the LV door. The new AIRT 500 may also have a data port on the LV module (not shown in FIG. 5) for remote signal to a SCADA or PLC based system to allow for trending and tracking the insulation levels.

A lot of Medium Voltage and High Voltage control systems are operated on 125 VDC power to allow for battery backup power. The old AIRT required a separate 120/240 volts AC (VAC) circuit to be brought into the control panels to operate the AIRT. The new AIRT 500 will have a built in inverter circuit to allow the AIRT to be operated on 125 VDC which will make it more applicable to these type control panels. The new AIRT system 500 will also have a battery UPS (uninterrupted power supply) option available to operate the AIRT in the event of a power failure. The system will also be available with an automatic and remote alarm signal reset option should maintenance personnel not be available. The new AIRT will have a Lock and Tag Out guard 538 on the On/Off switch 532 to allow maintenance personnel to turn off the AIRT 500 from the remote LED/control assembly 520 and insert a Lockout wire into the on/off switch guard 538 to prevent the AIRT from operating during maintenance to the equipment.

Figure 7:
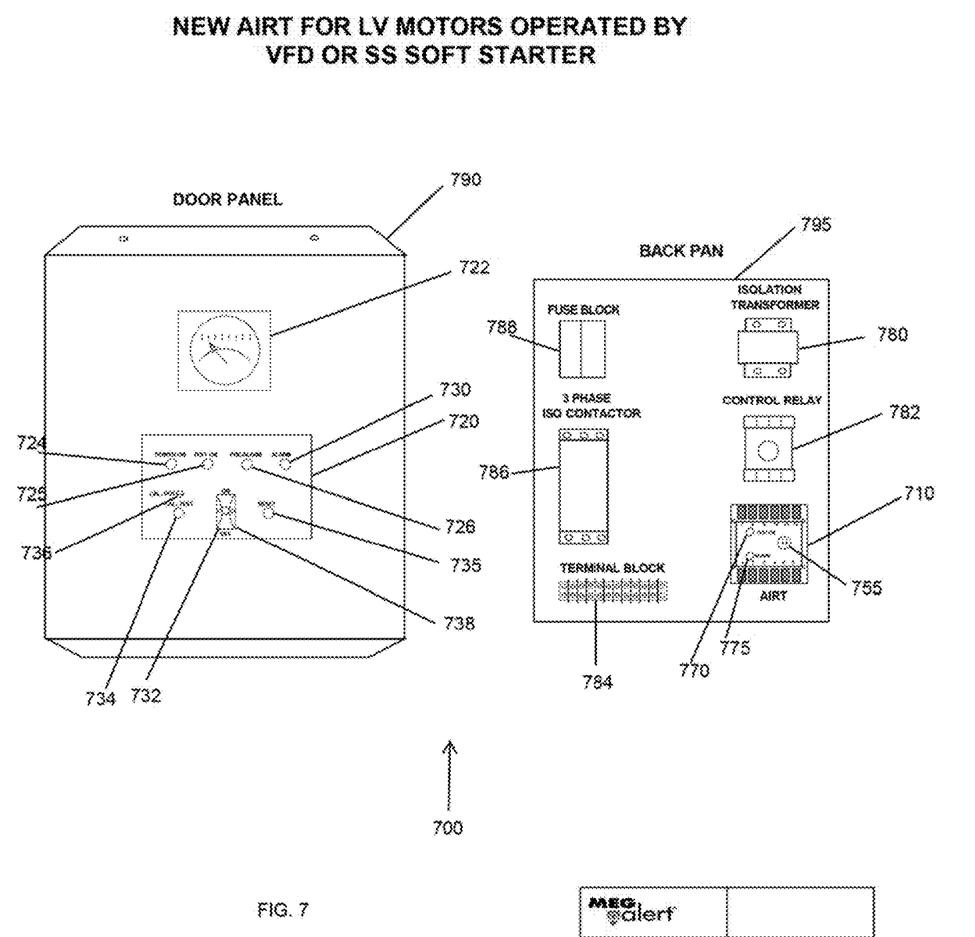
FIG. 7 shows an AIRT for LV motor operated by VFD or SS Soft Starter.

A fifth embodiment of the apparatus of the present invention includes an arc-safe Automatic Insulation Resistance Tester (AIRT) for low voltage (LV) motors operated by a variable frequency drive (VFD) or solid state (S.S.) soft starter (see FIG. 7).

A permanently installed automatic insulation resistance tester 700, having a test output of 500/1000 VDC, that is mounted in its own wall mount enclosure to be installed near the motor control cabinet. Unlike the AIRT described in U.S. Pat. Nos. 5,155,441 and 5,172,289, the present invention will preferably have an isolation contactor and timing circuit to allow the VFD or S.S. Soft Starter to be isolated from the motor circuit automatically when the AIRT tests the winding insulation resistance. In today's technology it is becoming very popular to operate motors with a VFD or S.S. Soft Starter in order to save on wear and tear on motor starting and save on energy consumption. The problem this brings is that there is no AIRT device made today that can operate on a motor that is powered by a VFD or S.S. Soft Starter device due to the design of these power sources. The old style AIRT will detect the input power ground of the VFD or S.S. Soft Starter when testing because the design of all the VFDs or S.S. Soft Starters allow for the AIRT to test back through the transistor/SCR circuitry, even when it is offline, to the input voltage source. The input power source of the VFD or S.S. Soft Starters is connected to earth ground for safety purposes and so the old style AIRT would detect that ground and go into a false alarm condition.

The new Arc-Safe AIRT VFD-SS Soft Start model 700 allows personnel to automatically test the motor winding insulation resistance without exposure to an Arc Flash condition and isolates the motor winding circuit automatically to allow for a correct test reading.

The system is preferably self-contained in a wall mount enclosure and will be sized to handle the starting current of the motor it will be testing. The AIRT system 700 preferably has a visual remote LED/display 720 and a megohm meter 722 to show the insulation resistance readings on the front panel 790. There is also preferably an indicator to show if the isolation circuit is operating or not (not shown in FIG. 7). The AIRT system 700 will also have a means to remote the analog signal on the megohm meter (not shown in FIG. 7) to a SCADA or PLC based system for remote monitoring and trending.

Figure 6:
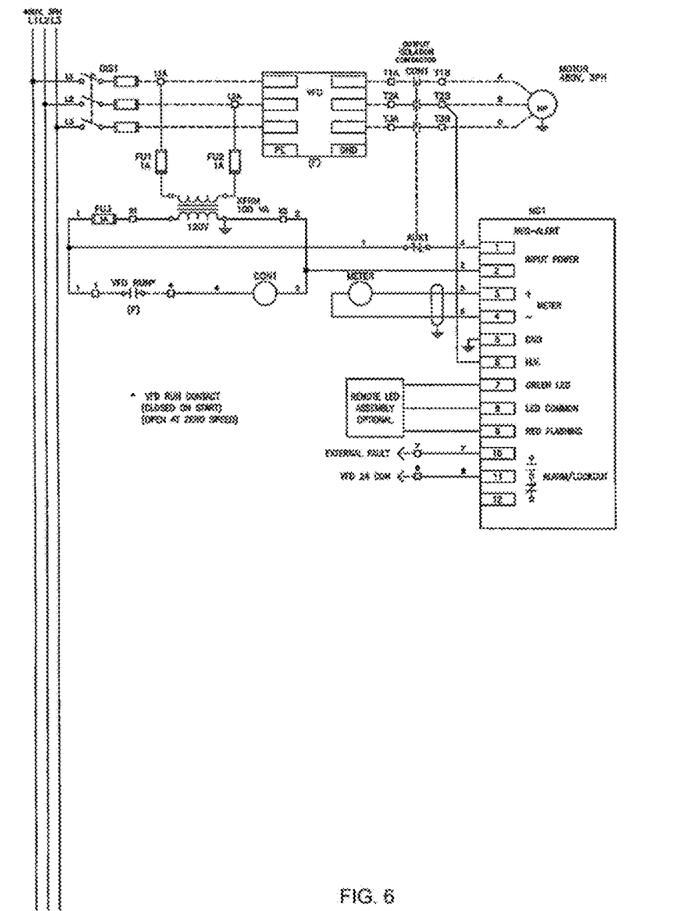
FIG. 6 is a circuit diagram for an arc-safe AIRT for motors operated by VFD or SS Soft Starter.

The new Arc-Safe AIRT system 700 provides customers with a one-piece compact packaged system for testing insulation resistance in motors operated by a VFD or S.S. Soft Starter that can easily be mounted and adopted to any existing motor control system. The system preferably has internal fusing, a power isolation transformer 780, a run control circuit, a time delay on operation circuit, an isolation contactor circuit, an AIRT circuit, a visual display megohm meter 722, an alarm output circuit, and a visual display LED/control assembly 720 on the front panel 790 (see FIGS. 6-7). The remote assembly 720 may have some or all of the following indicators and switches: power on LED 724, test on LED 725, pre-alarm LED 726, alarm LED 730, locking on-off switch 732 with a lock-out/tag-out guard 738, calibration/test switch 734, calibration potentiometer 736, and reset button 735. The system preferably has some or all of the following accessible from the back pan 795 of the new AIRT system: an AIRT module 710 with a cable receptacle 755, alarm LED 775, and test on LED 770; an isolation transformer 780; a control relay 782; a terminal block 784; a three-phase isolation contactor 786, and a fuse block 788. The system is preferably operated automatically from a run contact signal sent from the VFD or S.S. Soft Starter device to initiate the AIRT testing when the motor is offline and also discontinue the testing when the motor is online. When the AIRT system detects a low level of insulation resistance, it is capable of preventing the operation of the motor until the insulation level is safe to operate the motor. By preventing the operation of the motor when the insulation level is unsafe, the AIRT system 700 prevents damage to the motor and the VFD/S.S. Soft Starter devices, which are very costly to repair.

Figure 8:
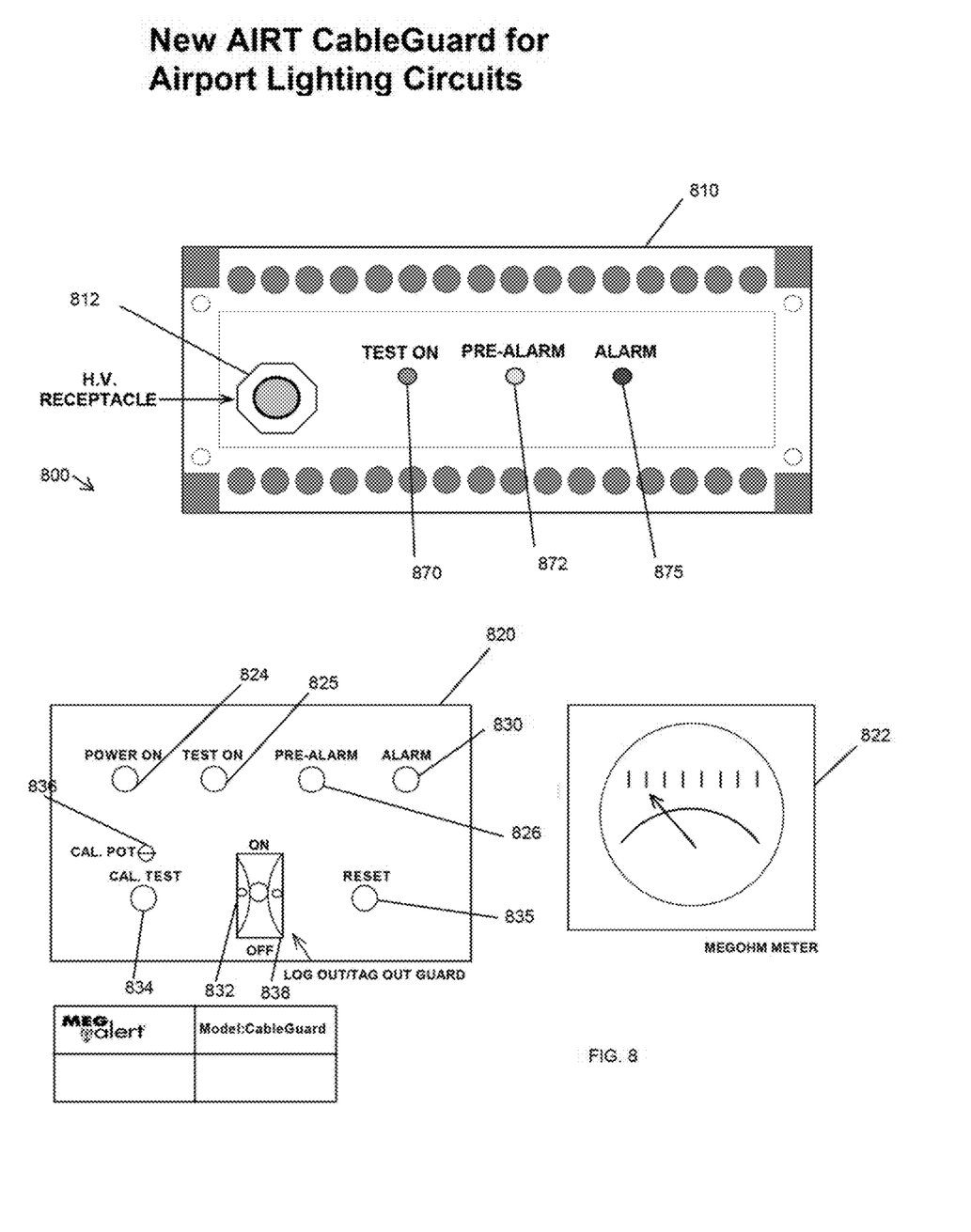
FIG. 8 shows an AIRT cable guard for airport lighting circuits.
Figure 9:
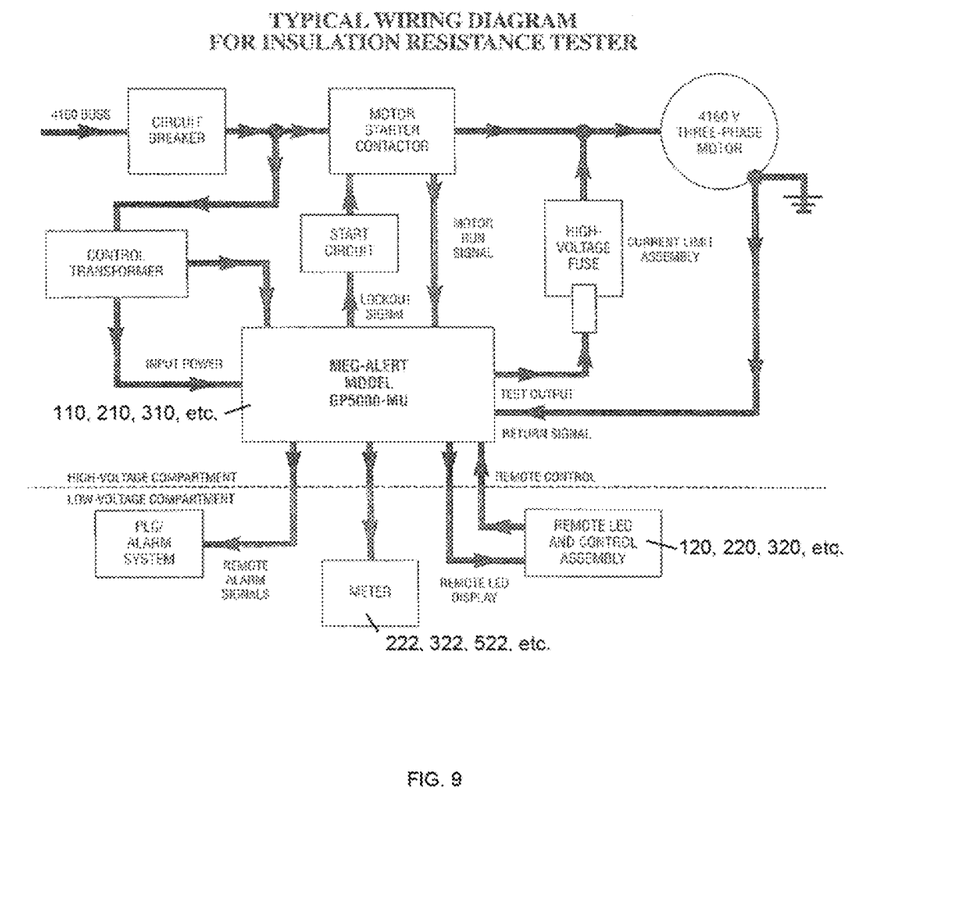
FIG. 9 shows a typical wiring diagram for an AIRT.
Figure 10:
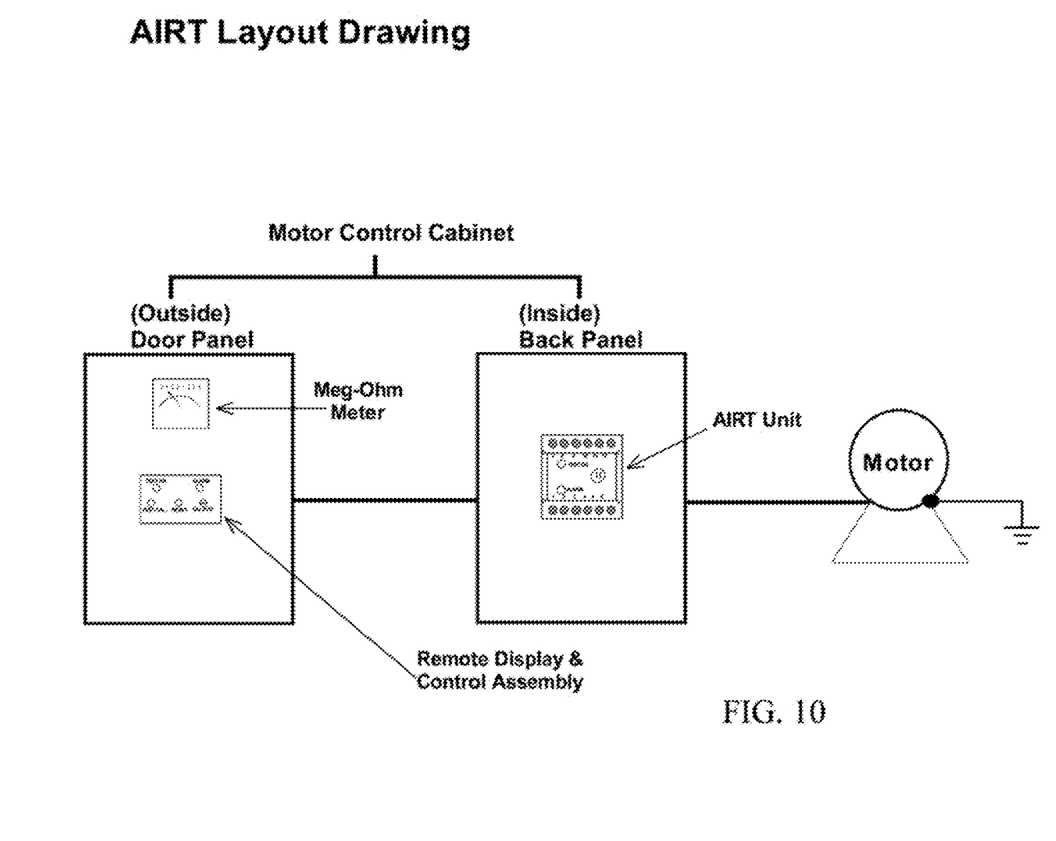
FIG. 10 shows a typical layout of an AIRT.

A sixth embodiment of the apparatus of the present invention includes an arc-safe cable-guard AIRT for LV and MV cables for airport lighting. This embodiment of the present invention includes a permanently installed automatic insulation resistance tester (AIRT) 810, having a test output of at least 500/1000 VDC (volts direct current), and has all the control devices needed to operate the AIRT and any indicators brought out to a remote panel 820 located on the outside of the control panel door. This allows the AIRT to be operated automatically without having to open the control panel door and exposing personnel to an Arc Flash accident. The Federal Aviation Administration (FAA) requires periodic insulation resistance testing of the airport lighting cable circuits at all airports during the year. This process has always required a manual test to be done by maintenance personnel with a portable hand testing device. In the past this testing required shutting down the runway or taxiway and having maintenance personnel open man hole covers and access the lighting cables to do the testing.

Some larger cable circuit (CC) regulator manufacturers have began offering a built-in insulation resistance test circuit option with their CC Regulator, but they have to purchased from the CC Regulator manufacturer as an option. The new AIRT Cable-Guard 800 is a stand-alone system compatible with any CC Regulator system and can easily be added to any existing cable lighting circuit system. The new AIRT Cable-Guard 800 preferably includes three parts: an AIRT module 810, a remote assembly 820, and a visual megohm meter display 822. While built-in insulation resistance optional circuits are very large and expensive, the new Cable AIRT 800 is compact and very low cost.

The industry accepted direct current (DC) test voltage used for testing the lighting cables is either 500 or 1000 VDC, even though some of the larger lighting circuits can operate at up to 4160 volts and should require 5000 VDC to properly test the dielectric condition of the insulation. This is because of the harsh environmental conditions that the cables are operated in, which prevents the cables from being tested properly at the higher voltages. The high voltage (HV) test would give a poor condition reading most of the time and cause a lot of nuisance maintenance repairs. The new AIRT unit 800 has a test output of 500 or 1000 VDC and has internal isolation circuit capabilities to enable the new AIRT unit 800 to test the lighting cables on systems with higher operating voltages up to 10,000 VDC. The small, inexpensive AIRT unit 800 is able to develop a test voltage of up to 1000 VDC and has Test On 870, Pre-alarm 872 and Alarm 875 outputs compatible with the existing airport alarm systems. The AIRT module 810 preferably has a HV Test output plug 812 for connecting to the HV lighting circuit and a ground terminal 811. When a low insulation reading occurs the new AIRT unit 800 preferably has Pre-Alarm 872 and Alarm 875 contacts that change state and a data port (not shown in FIG. 8) to send the megohm meter insulation readings to a remote SCADA (supervisory control and data acquisition) or PLC (programmable logic controllers) based industrial control system for trending and tracking. The new AIRT 800 is preferably equipped with a DIN (Deutsches Institut für Normung) rail mounting capability for easy installation.

The remote assembly 820 preferably includes a power-on LED 824, a test-on LED 825, a pre-alarm LED 826 and an alarm LED 830, along with a reset button 835, calibration potentiometer 836, calibration/test button 834, and a locking on/off switch 832 that preferably has a lock-out/tag-out guard 838.

The insulation resistance tester can comprise a heater control circuit to activate internal heaters (which can be space heaters) located inside a motor or generator to help remove any moisture causing the insulation levels to be low. Further, the heater control circuit can include means for de-activating the internal heater circuit when the insulation level returns to a safe level.

The various embodiments of the present invention share a common theme—most comprise automatic permanently installed insulation resistance test equipment for testing electrical equipment on the order of rated voltage.

1. Automatic permanently installed insulation resistance test equipment for testing electrical equipment on the order of rated voltage.
2. The Insulation Resistance tester of claim 1, also comprising a remote control assembly for operating the insulation tester from outside the control cabinet to prevent exposure of personnel to arc flash conditions.
3. The Insulation Resistance tester of claim 1 or 2, also comprising one or more of the following:
means for displaying "Power On" status
means for displaying "Test On" status
means for displaying "Alarm" conditions
means for initiating a system test and calibration
means for manually "Re-setting" the alarm condition
means for making calibrating adjustments to the tester.
means for touch pad control & digital function display.
an analog meter for displaying the Insulation Resistance level with color band for good, fair, bad.
An optional digital meter for displaying the Insulation Resistance level.

4. The Insulation Resistance tester of claim 3 designed for a reduced size to accommodate the minimal available space inside the new style compact control cabinets for motor and generators.

5. The Insulation Resistance tester of claim 1 further comprising:
a two part construction for medium voltage motor or generator control cabinets consisting of:
means for a small compact "HV sensing module" to be installed in the H.V.
compartment and a H.V. lead attaching to the current limiting resistor and fuse assembly and the winding of the motor or generator.
means for a small "monitoring module" to be installed in the L.V. compartment and a L.V. cable to connect said module to the: HV sensing module".
means for remote control and display assembly to be located outside the control cabinet on the L.V. door panel and L.V. cable to connect said assembly to the "monitoring module".

6A. Insulation Resistance Tester of claim 5 further comprising a H.V. sensing module with the new "iso-sense" circuit to replace the obsolete opto transistor circuit.

6B. Insulation Resistance Tester of claim 1 with the new iso-sense circuit comprising a H.V. transformer/current sense circuit to replace the obsolete opto transistor circuit which is unstable and inaccurate.

7. Insulation Resistance Tester of claim 1 further comprising a data output circuit and port to transmit the insulation resistance level consisting of:
means for transmitting the insulation resistance level with a 4-20 mA analog signal means for transmitting the insulation resistance level with a RS232/485 digital signal means with an Ethernet digital signal
means for electronically storing the insulation data for insulation resistance levels.

8. Insulation Resistance tester of claim 1 further comprising an automatic reset capability to allow alarm levels to reset automatically when manual reset is not feasible.
means for terminal connections for alarm reset capability via a remote relay contact signal.

9. Insulation Resistance tester of claim 1 further comprising an input power circuit to allow for operation with a commonly available D.C. input voltage (24 VDC and 125 VDC) means for including a D.C. battery back up power source 10. Insulation Resistance tester of claim 1 further comprising an "isolation" contactor necessary for testing motors operating on variable frequency drives or solid state soft starters.

11. Insulation Resistance tester of claim 1 further comprising a "space heater" control circuit to activate the internal space heaters located inside the motor or generator to help remove any moisture causing the insulation levels to be low.
means for de-activating the internal space heater circuit when the insulation level returns to a safe level.

12. Insulation Resistance tester of claim 1 further comprising a "voltage present" circuit to warn personnel that voltage is present inside of control cabinet to warn personnel of possible arc flash conditions.

13. Insulation Resistance tester of claim 1 further comprising a failsafe control sensing and alarm circuit.

14. Insulation Resistance tester of claim 1 further comprising and arc flash relay circuit to warn personnel of an arc flash condition present.

The old AIRTs for medium and high voltage made by the inventor's company are about 12" high by 4" wide by 8" deep (about 384 cu. inches—usually this was the minimum size).

The portion of the new AIRTs that goes into the high voltage compartment of the cabinet is about 6" high by 4" wide by 8" deep (about 192 cu. inches—usually this will be the minimum size); the remainder of the AIRT goes into the low voltage compartment of the cabinet.

PARTS LIST

The following is a list of parts and materials suitable for use in the present invention:

| Parts Number | Description |
| --- | --- |
| 100 | arc-safe AIRT for low-voltage equipment |
| 110 | AIRT module |
| 120 | remote LED control assembly |
| 125 | "test on" LED of remote assembly |
| 130 | "alarm" LED of remote assembly |
| 135 | reset button of remote assembly |
| 140 | AC input of AIRT module |
| 145 | control signal of AIRT module |
| 150 | lockout contacts of AIRT module |
| 155 | receptacle for connecting AIRT module to remote assembly |
| 160 | Test output and Ground terminal |
| 165 | alarm contacts |
| 170 | "test on" LED of AIRT module |
| 175 | "alarm on" LED of AIRT module |
| 200 | arc-safe AIRT for low-voltage equipment |
| 210 | AIRT module |
| 220 | remote LED control assembly |
| 222 | megohm meter display |
| 225 | "test on" LED of remote assembly |
| 230 | "alarm" LED of remote assembly |
| 235 | reset button of remote assembly |
| 240 | AC input of AIRT module |
| 245 | control signal of AIRT module |
| 250 | lockout contacts of AIRT module |
| 255 | receptacle for connecting AIRT module to remote assembly |
| 260 | Test Output and Ground terminal |
| 265 | alarm contacts |
| 270 | "test on" LED of AIRT module |
| 275 | "alarm on" LED of AIRT module |
| 300 | arc-safe AIRT for low-voltage equipment |
| 310 | AIRT module |
| 320 | remote LED control assembly |
| 322 | megohm meter display |
| 325 | "test on" LED of remote assembly |
| 330 | "alarm" LED of remote assembly |
| 334 | calibration/test switch of remote assembly |
| 335 | reset switch of remote assembly |
| 336 | calibration potentiometer of remote assembly |
| 340 | AC input of AIRT module |
| 345 | control signal of AIRT module |
| 350 | lockout contacts of AIRT module |
| 355 | receptacle for connecting AIRT module to remote assembly |
| 360 | Test Output and Ground terminal |
| 365 | alarm contacts |
| 370 | "test on" LED of AIRT module |
| 375 | "alarm on" LED of AIRT module |
| 400 | "ISO-SENSE" circuit |
| 402 | HV voltage multiplier circuit |
| 404 | resistor bridge |
| C16 | capacitor |
| C17 | capacitor |
| C18 | capacitor |
| C19 | capacitor |
| C20 | capacitor |
| C21 | capacitor |
| C22 | capacitor |
| C23 | capacitor |

-continued

| Parts Number | Description |
| --- | --- |
| C24 | capacitor |
| C25 | capacitor |
| C26 | capacitor |
| D7 | diode |
| D8 | diode |
| D9 | diode |
| D10 | diode |
| D11 | diode |
| D12 | diode |
| D13 | diode |
| D14 | diode |
| D15 | diode |
| D16 | diode |
| D17 | diode |
| D18 | diode |
| D19 | diode |
| D20 | diode |
| D21 | diode |
| D22 | diode |
| D23 | diode |
| D24 | diode |
| D25 | diode |
| D26 | diode |
| D40 | diode |
| R11 | resistor |
| R16 | resistor |
| R44 | resistor |
| T3 | output secondary of "ISO-SENSE" HV transformer |
| T4 | "ISO-SENSE" HV transformer |
| 500 | arc-safe AIRT for medium-voltage and high-voltage equipment |
| 505 | compact HV module |
| 510 | LV module |
| 515 | interconnecting cable |
| 520 | remote LED control assembly |
| 522 | megohm meter display |
| 524 | "power on" LED of remote assembly |
| 525 | "test on" LED of remote assembly |
| 526 | "pre-alarm" LED of remote assembly |
| 530 | "alarm" LED of remote assembly |
| 532 | locking on/off switch of remote assembly |
| 534 | calibration/test switch of remote assembly |
| 535 | reset switch of remote assembly |
| 536 | calibration potentiometer of remote assembly |
| 538 | lock-out/tag-out guard |
| 555 | receptacle for connecting modules, ohmmeter, and remote |
| 557 | ground terminal |
| 558 | HV Test Output plug |
| 700 | AIRT for LV motors operated by VFD or SS Soft Starter |
| 710 | AIRT module |
| 720 | remote LED control assembly |
| 722 | megohm meter display |
| 724 | "power on" LED of remote assembly |
| 725 | "test on" LED of remote assembly |
| 726 | "pre-alarm" LED of remote assembly |
| 730 | "alarm" LED of remote assembly |
| 732 | locking on/off switch of remote assembly |
| 734 | calibration/test switch of remote assembly |
| 735 | reset switch of remote assembly |
| 736 | calibration potentiometer of remote assembly |
| 738 | lock-out/tag-out guard |
| 755 | cable receptacle |
| 770 | "test on" LED of AIRT module |
| 775 | "alarm on" LED of AIRT module |
| 780 | power isolation transformer |
| 782 | control relay |
| 784 | terminal block |
| 786 | three-phase isolation contactor |
| 788 | fuse block |
| 790 | front/door panel |
| 795 | back pan |
| 800 | arc-safe AIRT Cable Guard for Airport Lighting Circuits |
| 810 | AIRT module |
| 811 | Ground terminal |
| 812 | HV Test Output plug |
| 820 | remote LED control assembly |
| 822 | megohm meter display |
| 824 | "power on" LED of remote assembly |
| 825 | "test on" LED of remote assembly |
| 826 | "pre-alarm" LED of remote assembly |
| 830 | "alarm" LED of remote assembly |
| 832 | locking on/off switch of remote assembly |
| 834 | calibration/test switch of remote assembly |
| 835 | reset switch of remote assembly |
| 836 | calibration potentiometer of remote assembly |
| 838 | lock-out/tag-out guard |
| 870 | "test on" LED of AIRT module |
| 872 | "pre-alarm" LED of AIRT module |
| 875 | "alarm" LED of AIRT module |

All measurements disclosed herein are at standard temperature and pressure, at sea level on Earth, unless indicated otherwise. All materials used or intended to be used in a human being are biocompatible, unless indicated otherwise.

The foregoing embodiments are presented by way of example only; the scope of the present invention is to be limited only by the following claims.

The invention claimed is:

1. An apparatus for automatically measuring insulation resistance of low voltage, medium voltage and high-rated voltage, grounded or ungrounded, electrical equipment, the apparatus comprising:
an automatic insulation resistance tester and monitoring module;
a heater located in the electrical equipment; and
a heater control circuit to automatically activate the heater when a measured insulation level falls below a specified threshold level.

2. The apparatus of claim 1, wherein the apparatus performs tests on the order of rated voltage and limits the maximum output voltage to a safe level.

3. The apparatus of claim 1, wherein the electrical equipment is a motor or generators, and the heater control circuit activates internal space heaters located inside the motor or generator.

4. The apparatus of claim 1, further comprising means for de-activating the heater when the insulation resistance returns to a safe level.

5. An automatic insulation resistance testing and monitoring apparatus for measuring insulation resistance of low voltage, medium voltage and high-rated voltage, grounded or ungrounded, electrical equipment having a control cabinet used to operate said electrical equipment and that control cabinet having a door panel, the apparatus comprising:
an automatic insulation resistance tester and monitoring module located in the control cabinet of the electrical equipment;
a heater located in the electrical equipment;
a heater control circuit to automatically activate the heater when a measured insulation level falls below a specified threshold level;
a remote control display assembly located outside the control cabinet of the electrical equipment and operatively connected to the insulation resistance tester and monitoring module located in the control cabinet for operating the insulation resistance tester and monitoring module located in the control cabinet without having to open the door panel and thus potentially exposing personnel to an arc flash accident; and an isolation circuit which includes a secondary high voltage sensing transformer with a primary winding connected in series with a main high voltage transformer secondary winding for completely isolating high voltage circuitry of the insulation resistance testing and monitoring apparatus from low voltage circuitry of the insulation resistance testing and monitoring apparatus and providing a signal to a meter that indicates an insulation value of the electrical equipment.

6. The apparatus of claim 5, wherein the apparatus performs the insulation resistance testing with a direct current test voltage on the order of the equipment's rated voltage and limits maximum output current to a safe level.

7. The apparatus of claim 5, further comprising at least one of the following: means for locking a power switch in an off position for lock out-tag out, means for guarding the apparatus power switch during a lock out-tag out procedure, means for displaying "Power On" status, means for displaying "Test On" status, means for displaying "Pre-Alarm" conditions, means for displaying "Alarm" conditions, means for initiating a system test and calibration, means for manually "Re setting" the alarm condition, means for making calibrating adjustments to the tester, means for touch pad control and digital function display, a meter for displaying the insulation resistance with a color band for good, fair, bad; an optional ground interrupter assembly; and means for preventing the equipment from operating when in an alarm condition.

8. The apparatus of claim 7, further comprising a high voltage module and a low voltage module, the high voltage module located in a high voltage compartment of the control cabinet of the electrical equipment, and the low voltage module located in a low voltage compartment of the control cabinet of the electrical equipment, wherein the high voltage module and low voltage module are connected to each other, and the low voltage module is connected to the remote control assembly.

9. The apparatus of claim 7, further comprising a data output circuit, the data output circuit including at least one of the following: means for transmitting insulation resistance level with a 4-20 mA analog signal; means for transmitting insulation resistance level with a RS232/485 digital signal; means for transmitting insulation resistance level with an Ethernet ModBus or other commonly used digital signals; and means for electronically storing insulation resistance data for trending and tracking the insulation resistance levels.

10. The apparatus of claim 7, further comprising an arc flash relay circuit to warn personnel of an arc flash condition present.

11. The apparatus of claim 5, wherein the electrical equipment is a motor or generator, and the heater control circuit activates internal space heaters located inside the motor or generator.

12. The apparatus of claim 5, wherein the apparatus also limits maximum output current to a safe level for the equipment and personnel, the apparatus further includes one or more of the following: means for indicating "test on" status; means for indicating "alarm" status; means for connecting to the remote assembly via a cable; means for lockout contacts; means for alarm contacts; means for alternating current input; means for control input; means for high voltage test output; and, the remote assembly includes one or more of the following: means for indicating "test on" status; means for indicating "alarm" status; means for indicating "pre-alarm" status; means for connecting to the apparatus via a cable; means for calibrating or testing the apparatus; means for resetting the apparatus; means for turning power of the apparatus on or off, said means able to be locked in an off position for lock out-tag out; means for guarding the means for turning the power of the apparatus on or off during a lock-out tag-out procedure; and means for displaying megohm readings.

13. The apparatus of claim 12, wherein the apparatus is installed in a pre-existing lighting circuit system.

14. The apparatus of claim 12, further comprising high voltage circuitry and low voltage circuitry, wherein the apparatus utilizes circuitry including a high voltage sensing transformer, a blocking diode, and a resistor bridge for completely isolating the high voltage circuitry from the low voltage circuitry and providing a signal to a meter that indicates the insulation value of the electrical equipment in meg-ohms.

15. The apparatus of claim 12, further including a ground interrupter assembly.

16. The apparatus of claim 12, wherein the apparatus can test multiple pieces of low voltage equipment at the same time, using only one remote/display switching assembly and one automatic insulation resistance tester multiple model unit.

17. The apparatus of claim 12, wherein the apparatus can be used on motors operated by variable frequency drives or solid state soft starters.

18. A conversion kit for converting an older model automatic insulation resistance test apparatus into the automatic insulation resistance testing and monitoring apparatus described in claim 5.

19. An apparatus for testing and monitoring insulation resistance of a low voltage, medium voltage, or high-rated voltage electrical motor operated by a variable frequency drive or solid state soft starter contained in a control cabinet having a door panel, the apparatus including:

an automatic insulation resistance tester and monitoring module or measuring the insulation resistance of the motor, a remote control display assembly located outside the door panel of the control cabinet, a megohm meter located outside the door panel of the control cabinet for displaying megohm readings, an automatic isolation contactor, with an isolation contactor control on and delay off timing circuit for testing the motor operating on the variable frequency drive or the solid state soft starter;

an isolation circuit which includes a secondary high voltage sensing transformer with a primary winding connected in series with a main high voltage transformer secondary winding for completely isolating high voltage circuitry of the insulation resistance testing and monitoring apparatus from low voltage circuitry of the insulation resistance testing and monitoring apparatus and providing a signal to the megohm that indicates an insulation value of the electrical motor;

a heater located in the electrical motor; and a heater control circuit to automatically activate the heater when a measured insulation level falls below a specified threshold level.

20. The apparatus of claim 19, further comprising means for de-activating the heater when the insulation resistance returns to a safe level.

* * * * *